United States Patent [19]

Minomura

[11] 4,238,232
[45] Dec. 9, 1980

[54] METALLIC MODIFIED MATERIAL OF INTERMETALLIC COMPOUND

[76] Inventor: Shigeru Minomura, 2-10-6, Sukura, Setagaya-ku, Tokyo 156, Japan

[21] Appl. No.: 104,464

[22] Filed: Dec. 17, 1979

Related U.S. Application Data

[63] Continuation of Ser. No. 886,581, Mar. 14, 1978, abandoned.

[30] Foreign Application Priority Data

Mar. 14, 1977 [JP] Japan .................................. 52-27095

[51] Int. Cl.³ ............................................ C01C 15/00
[52] U.S. Cl. ................................ 75/134 T; 75/134 P; 204/192 SP; 204/192 S; 204/192 P; 252/62.3 GA; 423/299; 423/409
[58] Field of Search ........................ 75/134 T, 134 P; 204/192 SP, 192 S, 192 P; 423/299, 406, 409, 412; 252/62.3 GA

[56] References Cited

U.S. PATENT DOCUMENTS

| | | | |
|---|---|---|---|
| 3,979,271 | 9/1976 | Noreika et al. | 204/192 S |
| 4,013,533 | 3/1977 | Cohen-Solal et al. | 204/192 S |
| 4,057,476 | 11/1977 | Krikorian et al. | 204/192 S X |
| 4,086,555 | 4/1978 | Krikorian et al. | 204/192 P X |

OTHER PUBLICATIONS

Jamieson, J. C., "Crystal Structures at High Pressures . . .", Science, vol. 139, Mar 1, 1963, pp. 845–847.
Shimomura et al., "Pressure Induced . . . ImSb", Philosophical Mag., vol. 34, No. 5, 1976, pp. 839–849.
Asaumi et al., "Pressure–Induced Structural . . . ImSb", J. Physical Soc., Japan, vol. 41, No. 5, Nov. 1976, pp. 1630–1635.
Jayaraman et al., "Melting and Polymorphism . . . Diamond . . . Structure", Physical Rev., vol. 130, No. 2, Apr. 15, 1963, pp. 540–547.
Russel et al., "Structure . . . Properties . . . GaAs Films . . .", 12th IEEE Photovoltaic Specialists Conf. (Abstract) 1976.
Ueda, R., "Synthesis . . . of CdTe . . . Neutral and Ionized Beams", J. Crystal Growth, vol. 31, 1975, pp. 333–338.
Szczyrbowski et al., "D.C. Sputtering of Thin Indium Arsenide Films", Thin Solid Films, vol. 42, 1977, pp. 193–200.
Ogawa et al., "Deposition of . . . Nb Films by Tetrode Sputtering", J. Vacuum Sci. & Tech., vol. 8, No. 1, pp. 192–194.

*Primary Examiner*—R. Dean
*Assistant Examiner*—W. G. Saba
*Attorney, Agent, or Firm*—Wenderoth, Lind & Ponack

[57] ABSTRACT

The present invention is concerned with a new metallic modified material of intermetallic compound, which has the same chemical composition as an intermetallic compound semi-conductor with a zincblende-type or wurtzite-type crystalline structure and further has a rocksalt-type crystalline structure and which is stable at room temperature under atmospheric pressure to a high pressure.

1 Claim, 9 Drawing Figures

FIG. 5
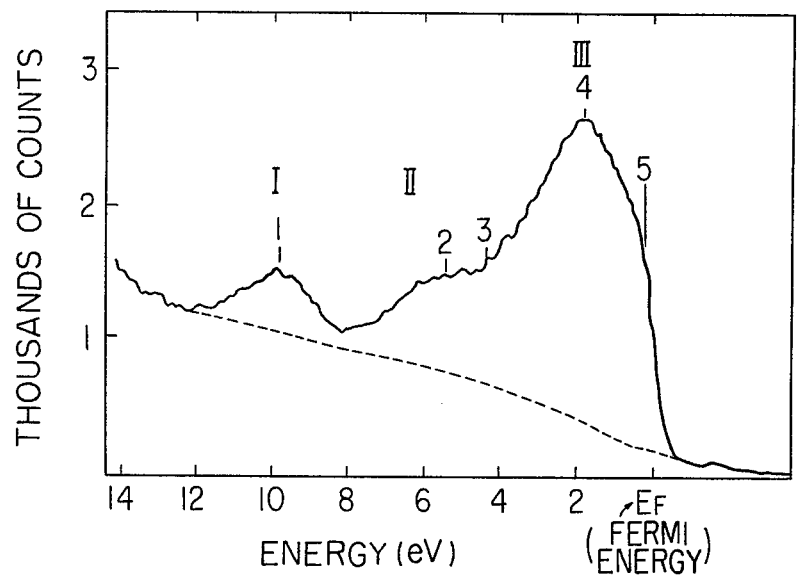
(a)
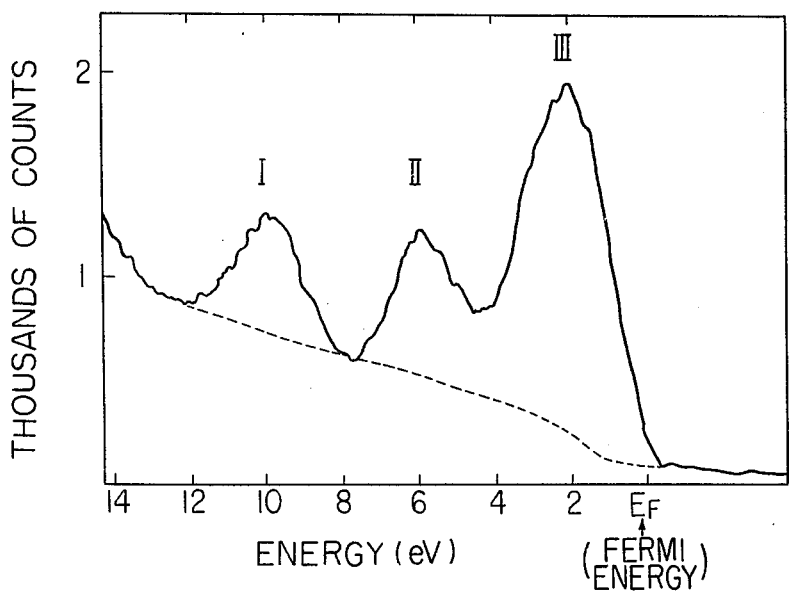
(b)

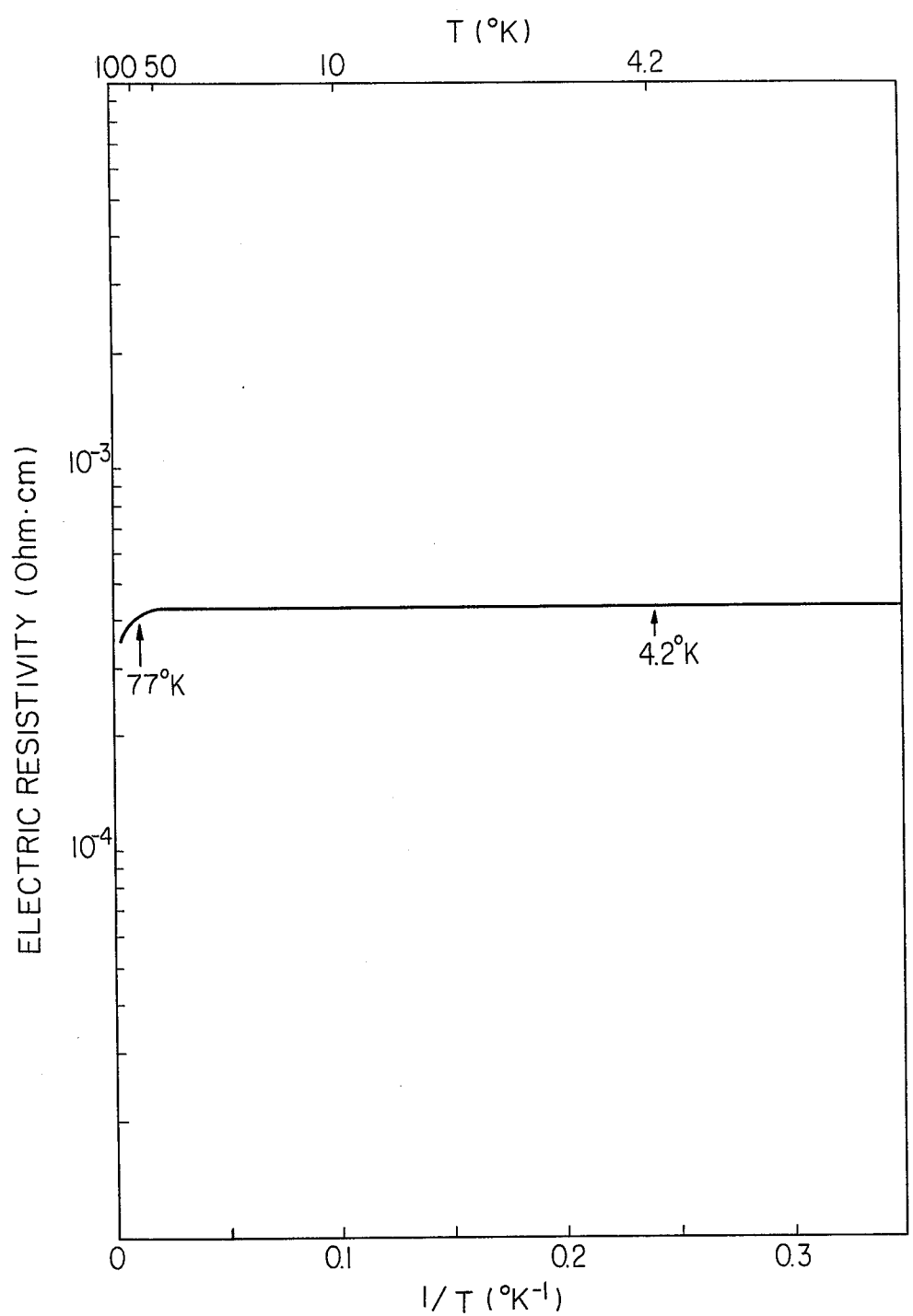

METALLIC MODIFIED MATERIAL OF INTERMETALLIC COMPOUND

This is a continuation, of application Ser. No. 886,581, filed Mar. 14, 1978, now abandoned.

BACKGROUND OF THE INVENTION

1. Field of the Invention

The present invention relates to a new metallic modified material having the same chemical composition as an intermetallic compound semiconductor but differing in crystalline structure and a process for the production of the same.

2. Description of the Prior Art

As an intermetallic compound semiconductor, there are known Group III-V compounds having a zincblende-type or wurtzite-type crystalline structure such as InSb, InAs, InP, GaSb, GaAs, GaP, etc., Group II-VI compounds such as ZnS, ZnSe, ZnTe, CdS, CdSe, CdTe, BeO, etc., Group I-VII compounds such as CuCl and Group IV-VI compounds having a rocksalt type crystalline structure such as PbS, PbSe, PbTe, SnTe, etc. On the other hand, it is known that amorphous semiconductors of intermetallic compounds are formed on substrates by vacuum deposition method or by sputtering method. When intermetallic compound semiconductors are exposed to a high pressure at room temperature, for example, InSb, GaSb, AlSb, etc. are transformed into a white-tin-type crystalline structure and InAs, InP, ZnSe, ZnTe, CuCl, etc. are transformed into a rocksalt type crystalline structure, thus behaving themselves like a metal. However, phase transition into the semiconductor phase takes place when the pressure is lowered to normal pressure. It is also known that the high pressure metallic phase of Group III-V compounds is obtained as a metastable phase when the pressure is lowered to normal pressure at 77° K.

The inventors have previously reported that an amorphous InSb semiconductor is transformed into a material of rocksalt-type crystalline structure under a high pressure such as of about 10 Kbar, which is further transformed into a material of white-tin-type crystalline structure under a high pressure such as about 30 Kbar and which is transformed into a mixture of zincblende-type crystalline structure and rocksalt-type crystalline structure when the pressure is lowered to normal pressure. Thus, this is unstable under high pressures.

SUMMARY OF THE INVENTION

It is an object of the present invention to provide a novel metallic modified material having the same chemical composition as an intermetallic compound semiconductor but differing in crystal structure.

It is another object of the present invention to provide a novel metallic modified material suitable for use in heterojunction devices.

It is a further object of the present invention to provide a process for the production of a metallic modified material of intermetallic compound by sputtering.

These objects can be attained by a metallic modified material of intermetallic compound, which has the same chemical composition as an intermetallic compound semiconductor with a zincblende-type or wurtzite-type crystalline structure and further has a rocksalt-type crystalline structure and which is stable at room temperature to a predetermined temperature under normal pressure to high pressure, and by a process for the production of a metallic modified material of intermetallic compound which comprises depositing from a target consisting of an intermetallic compound semiconductor with a zincblende-type or wurtzite-type crystalline structure a metallic modified material of intermetallic compound with a rocksalt crystalline structure and the same chemical composition as the target on a substrate by tetrode-type sputtering.

BRIEF DESCRIPTION OF THE DRAWING

The accompanying drawings are to illustrate the principle and merits of the present invention in more detail.

FIG. 6 is a graph showing the thermal effect of from room temperature to 4.2° K. on the resistivity of the metallic modified material of InSb.

DETAILED DESCRIPTION OF THE INVENTION

In accordance with the present invention, there is provided a metallic modified material (metallic modifications) of intermetallic compound, which has the same composition as an intermetallic compound semiconductor with a zincblende type or wurtzite type crystalline structure and further has a rocksalt-type crystalline structure and which is stable at room temperature to a predetermined temperature under atmospheric pressure to high pressures. In the present invention, the intermetallic compound is selected from the group consisting of Group III-V compounds, Group II-VI compounds, Group I-VII compounds, Group IV-VI compound-containing mixtures with these compounds and mixtures thereof. The deposition can be carried out in the presence of at least one reactive gaseous composition comprising at least one component selected from Group II, III, IV, V and VI elements.

In one embodiment of the present invention, from a target of a zincblende-type semiconductor consisting of two components selected from Group III elements and Group V elements is deposited the metallic modified material of intermetallic compound having the same chemical composition as the target and a rocksalt-type crystalline structure on a substrate by tetrode sputtering.

In another embodiment of the present invention, from a target consisting of a combination of two kinds of semiconductors of Group III-V compounds with other Group III-V compounds, Group IV elements or Group II-VI compounds is deposited a metallic modified material of intermetallic compound consisting of at least three components, the content of the each component being 1% or more, and having a rocksalt-type crystalline structure on a substrate by tetrode sputtering.

In a further embodiment of the present invention, from a target consisting of a combination of two kinds of semiconductors of Group III-V compounds with other Group III-V compounds, Group IV elements or Group II-VI compounds and at least one reactive gaseous composition comprising at least one component selected from the above described elements is deposited a metallic modified material of intermetallic compound consisting of at least the three components, the content of the each component being 1% or more, and having a rocksalt-type crystalline structure on a substrate by discharge using a tetrode sputtering apparatus.

These metallic modified material of intermetallic compounds can be deposited on a glass substrate, single crystal substrate or polycrystalline substrate as a bulky sample by controlling the anode voltage of a tetrode sputtering apparatus to a threshold value or more. According to the present invention, it is further found that the crystalline structure of such a metallic modified material is controlled by the anode voltage of tetrode sputtering but is independent on the variety or state of a substrate and on the deposition rate on a substrate.

The present invention will now be illustrated in detail by the accompanying drawings.

Figure 1:
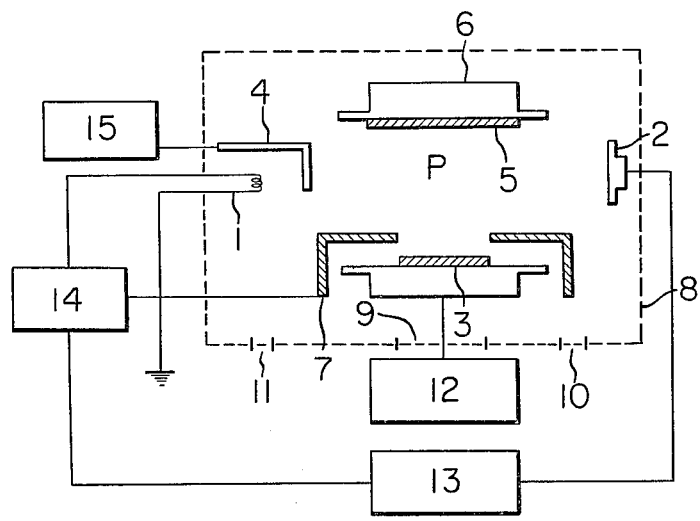
FIG. 1 is a schematic view of tetrode-type sputtering system used in the present invention.

FIG. 1 shows a schematic view of tetrode sputtering apparatus suitable for the purpose of depositing a metallic modified material of intermetallic compound having a rocksalt-type crystalline structure. In this system, four electrodes, i.e., cathode 1, anode 2, target 3 and auxiliary anode (stabilizer) 4 are arranged and substrate 5 is fitted to the surface of substrate holder 6 in parallel to target 3 to be apart therefrom by about 20 cm, the target having shield plate 7. Vacuum chamber 8 is evacuated from exhaust port 9 to $1 \times 10^{-8}$ Torr and high purity argon gas is fed from inlet 10 while keeping the evacuation to keep the pressure at about $2-8 \times 10^{-4}$ Torr. Direct current is passed through cathode 1 to emit thermoelectrons and a constant voltage of 300 V is applied to auxiliary anode 4 to bring the thermoelectrons into collision with the argon atoms and to induce ionization of the argon atoms, thus generating a plasma P. The voltage of the argon plasma is controlled by applying a certain voltage to anode 2. 11 is an inlet for a reactive gas, 12 is a radio frequency power supply, and 13, 14 and 15 are respectively direct current power supplies. When a radio frequency voltage with a constant frequency of 13.56 MHz and voltage of about $\pm 1-2$ kV is applied to the target, the surface of the target is kept negative to the plasma every half cycle and intermetallic compound semiconductor atoms are thus sputtered, thus being deposited a metallic modified material of intermetallic compound having a rocksalt type crystalline structure on the substrate. The metallic modified material of intermetallic compound according to the present invention is deposited on the substrate by applying generally to anode 2 a voltage of more than the threshold value of about 60 V, preferably, 90 to 150 V to control the voltage of argon plasma P, while a crystal of intermetallic compound or amorphous semiconductor is deposited on the substrate by applying generally a voltage of less than the threshold value of about 60 V to anode 2. The crystalline structure of such a deposited material depends on the voltage applied to anode 2. However, control of the pressure of pure argon gas introduced into vacuum chamber 8 ($2-8 \times 10^{-4}$ Torr) and the high frequency voltage applied to target 3 ($\pm 1-2$ kV) does not affect the crystalline structure of a deposited material, but affects the deposition rate.

The following examples are given in order to illustrate the present invention in greater detail without limiting the same.

Firstly, a metallic modified material with a rocksalt-type crystalline structure is deposited from a semiconductor target of indium antimonide (InSb) with a zincblende-type crystalline structure.

A semiconductor target of indium antimonide is fitted to a tetrode sputtering apparatus and a sample is prepared on a glass substrate or crystal substrate at a deposition rate of about 1 μm/hr by evacuating previously the vacuum chamber to a vacuum degree of $1 \times 10^{-8}$ Torr, introducing high purity argon gas with keeping the pressure at $2-8 \times 10^{-4}$ Torr, applying a voltage to the anode with varying from 20 V to 150 V and applying a high frequency voltage of $\pm 1-2$ kV to the target. As a result of the X-ray diffraction test of the sample, it is found that an amorphous semiconductor is obtained at a voltage applied to the anode of about 60 V or less, while a metallic modified material having a rocksalt-type structure is obtained at about 60 V or more.

Figure 2:
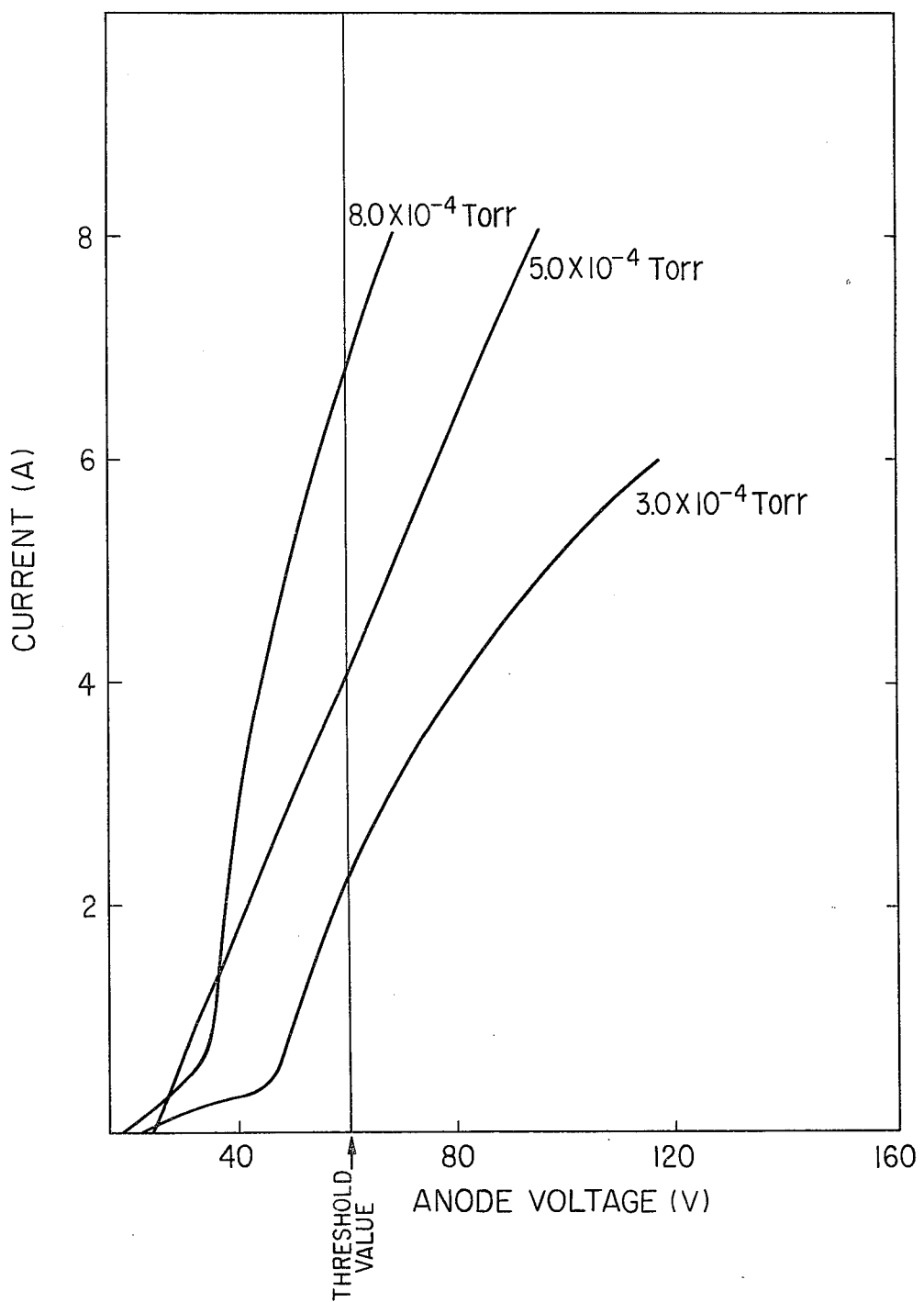
FIG. 2 is a graph showing the relation of the threshold value of anode voltage and the current.

FIG. 2 is a graph showing the relation of the threshold value of anode voltage with the current, in which the right side of the threshold value shows the rocksalt-type zone and the left side shows the amorphous zone.

Figure 3:
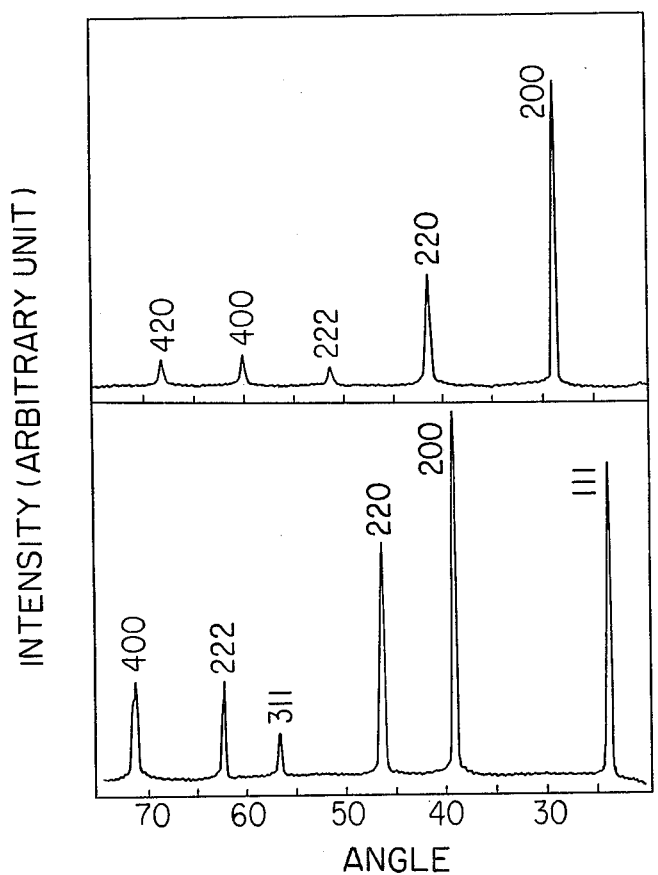
FIG. 3 is X-ray diffraction patterns of rocksalt-type InSb and zincblende-type InSb for comparison.

FIG. 3 shows X-ray diffraction patterns of the metallic modified material of indium antimonide having a rocksalt-type crystalline structure, deposited on a glass substrate by the above described method (upper graph) and the known polycrystalline semiconductor of indium antimonide having a zincblende-type crystalline structure (lower graph). The each peak is marked with the plane index. When using a clean glass substrate polished to give an optical surface, the plane (1 0 0) of the rocksalt-type polycrystal is oriented in parallel to the surface of the substrate and when the substrate is heated at 200° C., for example, the rocksalt-single crystal is obtained. X-ray diffraction test of the rocksalt-type modified material of indium antimonide teaches that it has a lattice constant of 6.11 Å and a density of 6.92 g/cm$^3$.

Figure 4:
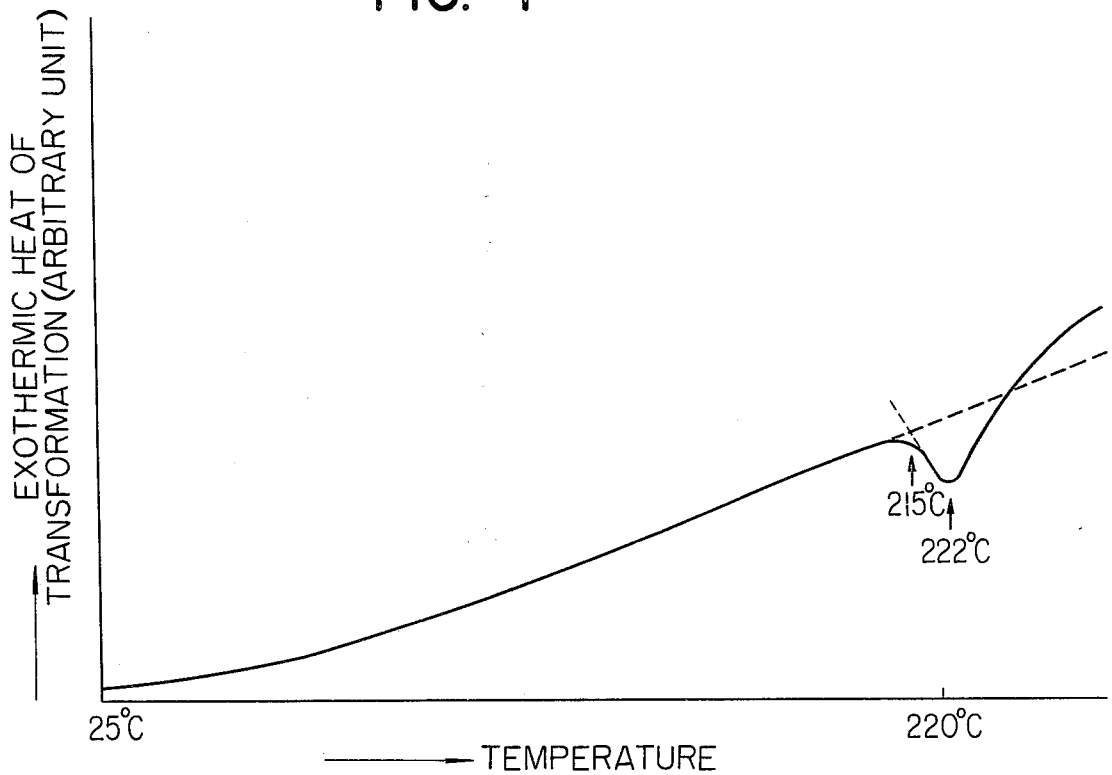
FIG. 4 is a graph showing the results of differential thermal analysis as to the metallic modified material of InSb having a rocksalt crystalline structure according to the present invention, FIG. 5 are photoelectron spectra of valence bands of the metallic modified material (a) consisting of rocksalt-type InSb and zincblende-type single crystal semiconductor (b)

FIG. 4 is a graph showing the results of differential thermal analysis of the metallic modified material of indium antimonide having a rocksalt-type crystalline structure according to the present invention. This new material is exothermically transformed into a material having a zincblende-type crystalline structure at 215° C. by heating under normal pressure at a heating rate of 10° C./min but remains metastable even by heating at 200° C. for a long time. Chemical analysis of this metallic modified material by X-ray microanalyzer shows that it is very pure and consists of antimony atom and indium atom in a composition ratio of 1.00±0.01, while chemical analysis of the same material by X-ray photo-emission spectra show that it has a very high purity as well as a metallic feature with a large electron density of states at the Fermi level.

FIG. 5 shows the difference of the photoelectron spectra of valence bands as to (a) the rocksalt-type metallic modified material of indium antimonide and (b) the zincblende-type single crystal semiconductor.

FIG. 6 shows the temperature effect of from room temperature to 4.2° K. on the resistivity of the metallic modified material of indium antimonide. The electrical resistivity ρ of this new material, being substantially independent upon temperatures, is about $3\times10^{-4}/\Omega$.cm. The Hall coefficient $R_H$ is about $3\times10^{-3}$ cm$^3$/C and the polarity of the Hall voltage is negative. Assuming that electric current consists of electrons only, an electron density of electric current of about $2.1\times10^{21}$ cm$^{-3}$ is determined from the value of the Hall coefficient. This new material shows a superconductive transition at 3.4±0.2° K. and a very high crystical magnetic field such as 9 to 10 KG. This new material can be used as a high accuracy resistor utilizing the phenomenon that the electric resistivity is independent upon temperatures.

Figure 7:
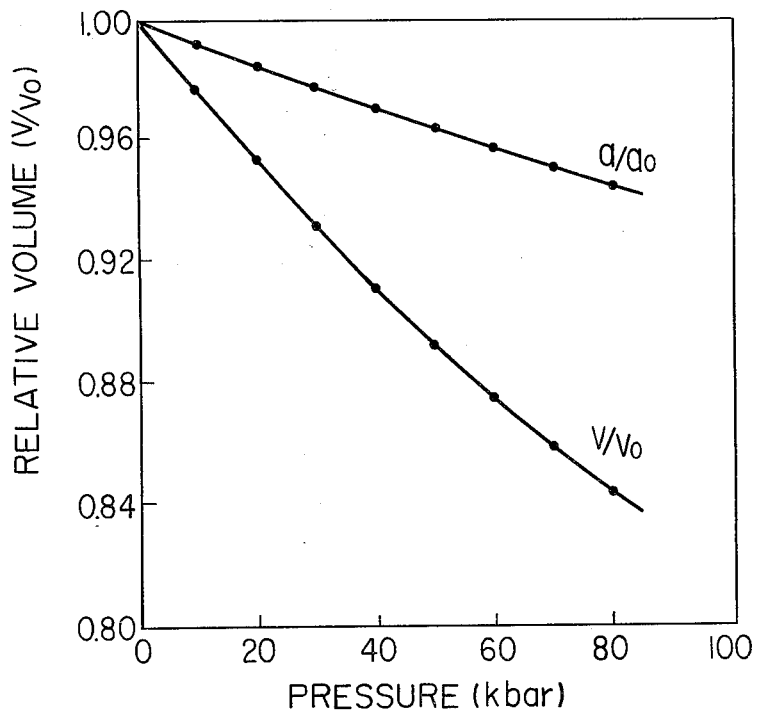
FIG. 7 is a graph showing the change of volume and lattice constant with pressure.

The rocksalt-type modified material of indium antimonide deposited by tetrode sputtering shows no phase transition under a pressure of up to about 80 Kbar at room temperature. FIG. 7 shows the change of the volume and lattice constant of this new material with pressures (V/Vo and a/a$_o$ respectively). A compressibility of $2.5\times10^{-6}$ bar $^{-1}$ and a bulk modulus of 400 Kbar are determined from the pressure-volume curve in the 0-20 Kbar zone. The inventors have already found that an amorphous semiconductor of indium antimonide is transformed into a material with a rocksalt-type crystalline structure under a pressure of about 10 Kbar and present as the rocksalt-type modified material even if the pressure is lowered to normal pressure and have reported this in "Philosophical Magazine," 1976, Vol. 34, No. 5, page 839-849. However, the rocksalt-type modified material transformed from an amorphous semiconductor by pressure is transformed into a material of white-tin-type crystalline structure under a pressure of about 30 Kbar, which is transformed into a mixture of a zincblende-type modified material and rocksalt-type modified material if the pressure is lowered to normal pressure, which is thus different from the rocksalt-type modified material deposited by tetrode sputtering.

The physical properties of the rocksalt-type metallic modified material of indium antimonide are summarized in Table 1 with those of the known zincblende-type single crystal semiconductor for comparison.

Table 1

Comparison of Physical Properties of Rocksalt-type Metallic Modified Material and Zincblende-type Single Crystal Semiconductor

| Physical Property | Unit | Rocksalt-type Metal | Zincblende-type Semiconductor |
| --- | --- | --- | --- |
| Density | g/cm$^3$ | 6.92 | 5.80 |
| Lattice Constant | Å | 6.11 | 6.47 |
| Compressibility | kbar | $2.5\times10^{-3}$ | $3.5\times10^{-3}$ |
| Bulk Modulus | kbar | 400 | 285 |
| Stable Temp. | °C. | 215 | 525 |
| Stable Pressure | kbar | 80 | 30 |
| Superconductivity Transition | °K. | 3.4 ± 0.2 | No |
| Crytical Magnetic Field | kG | 9-10 | No |
| Electrical Resistivity | cm | $4\times10^{-4}$ | $1\times10^{-1}$ |
| Hall Coefficient | cm$^3$/c | $3\times10^{-3}$ | $1\times10^2$ |
| Electron Density of Electric Current | cm$^{-3}$ | $2\times10^{21}$ | $1\times10^{16}$ |

Secondly, a metallic modified material having a rocksalt-type crystalline structure of intermetallic compound consisting of at least three components is deposited from a target consisting of a combination of at least two kinds of semiconductors selected from Group II, Group III, Group IV, Group V and Group VI elements.

In Table 2 are shown combination examples of two kinds of semiconductor targets used for the deposition of such metallic modified materials, in which x represents a numeral of larger than about 0.01 and $x+(1-x)=1$.

Table 2

| Metallic Modified Material | Combination of Semiconductor Target |
| --- | --- |
| InSb$_{1-x}$P$_x$ | InSb-InP |
| InSb$_{1-x}$As$_x$ | InSb-InAs |
| In$_{1-x}$Al$_x$Sb | InSb-AlSb |
| In$_{1-x}$Ga$_x$Sb | InSb-GaSb |
| In$_{1-x}$Ti$_x$Sb | InSb-TlSb |
| (InSb)$_{1-x}$(GaP)$_x$ | InSb-GaP |
| (InSb)$_{1-x}$(GaAs)$_x$ | InSb-GaAs |
| (InSb)$_{1-x}$Si$_x$ | InSb-Si |
| (InSb)$_{1-x}$Ge$_x$ | InSb-Ge |
| (InSb)$_{1-x}$Sn$_x$ | InSb-Sn |
| (InSb)$_{1-x}$(ZnX)$_x$ | InSb-ZnS |
| (InSb)$_{1-x}$(ZnSe)$_x$ | InSb-ZnSe |
| (InSb)$_{1-x}$(ZnTe)$_x$ | InSb-ZnTe |
| (InSb)$_{1-x}$(CdS)$_x$ | InSb-CdS |
| (InSb)$_{1-x}$(CdSe)$_x$ | InSb-CdSe |
| (InSb)$_{1-x}$(CdTe)$_x$ | InSb-CdTe |

A target consisting of a combination of two kinds of semiconductors as described above is fitted to a tetrode sputtering apparatus and a sample is prepared on a glass substrate or crystal substrate at a deposition rate of about 1 μm/hr by evacuating previously the vacuum chamber to a vacuum degree of $1\times10^{-8}$ Torr, introducing high purity argon gas with keeping the pressure at $2-8\times10^{-4}$ Torr, applying a voltage to the anode with varying from 60 V to 150 V and applying a high frequency voltage of ±1−2 KV to the target. This deposited material has a rocksalt-type crystalline structure and an electrical resistivity of about $4\times10^{-4}$ Ωcm. The relative ratio of the components of the deposited metallic modified material can be controlled by controlling the composition of one body target consisting of two kinds of semiconductors or by controlling the effective areas of two kinds of targets arranged separately.

For example, a metallic modified material having a rocksalt structure of indium arsenide (InAs) shows a lattice constant of 5.73 Å and density of 6.71 g/cm$^3$ at normal pressure and room temperature, while another metallic modified material having a rocksalt structure of indium antimonide (InSb) shows a lattice constant of 6.11 Å and density of 6.92 g/cm$^3$.

A ternary system metallic modified material of indium, antimony and arsenic with a composition ratio of $0 \leq X \leq 1$ is deposited from one body target consisting of a combination of indium antimonide and indium arsenide or from targets arranged separately.

Thirdly, a metallic modified material having a rocksalt-type crystalline structure of intermetallic compound consisting of at least three components is deposited from two kinds of zincblende-type semiconductor targets consisting of at least two components selected from the foregoing elements and at least one reactive gaseous composition containing at least one components selected from the foregoing elements. In Table 3, there are shown examples of combinations of zincblende-type semiconductor targets and reactive gases used for the deposition of such a metallic modified material, in which x is a numeral of larger than about 0.01 and $x+(1-x)=1$.

Table 3

| Metallic Modified Material | Combination of Semi-conductor Targets | Reactive Gas |
|---|---|---|
| $InSb_{1-x}P_x$ | InSb-InP | $PH_3$ or $P(C_2H_5)$ |
| $InSb_{1-x}As_x$ | InSb-InAs | $AsH_3$ or $As(C_2H_5)_3$ |
| $In_{1-x}Al_xSb$ | InSb-AlSb | $AlH_3$ or $Al(C_2H_5)_3$ |
| $In_{1-x}Ga_xSb$ | InSb-GaSb | $GaH_3$ or $Ga(C_2H_5)_3$ |
| $In_{1-x}Tl_xSb$ | InSb-TlSb | $TlH_3$ or $Tl(C_2H_5)_3$ |
| $(InSb)_{1-x}(GaP)_x$ | InSb-GaP | $GaH_3$ and $PH_3$ |
| $(InSb)_{1-x}(GaAs)_x$ | InSb-GaAs | $GaH_3$ and $AsH_3$ |
| $(InSb)_{1-x}Si_x$ | InSb-Si | $SiH_4$ |
| $(InSb)_{1-x}Ge_x$ | InSb-Ge | $GeH_4$ |
| $(InSb)_{1-x}Sn$ | InSb-Sn | $Sn(CH_3)_4$ |
| $(InSb)_{1-x}(ZnS)_x$ | InSb-ZnS | $H_2S$ |
| $(InSb)_{1-x}(ZnSe)_x$ | InSb-ZnSe | $(C_2H_5)_2Se$ |
| $(InSb)_{1-x}(ZnTe)_x$ | InSb-ZnTe | $(C_2H_5)_2Te$ |
| $(InSb)_{1-x}(CdS)_x$ | InSb-CdS | $H_2S$ |
| $(InSb)_{1-x}(CdSe)_x$ | InSb-CdSe | $(C_2H_5)_2Se$ |
| $(InSb)_{1-x}(CdTe)_x$ | InSb-CdTe | $(C_2H_5)_2Te$ |
| $(InSb)_{1-x}(PbTe)_x$ | InSb-PbTe | $(C_2H_5)_2Te$ |

A target consisting of a combination of two kinds of semiconductors as described above is fitted to a tetrode sputtering apparatus and a metallic modified material consisting of at least three components is deposited on a glass substrate plate or crystal substrate plate by evacuating previously the vacuum chamber to a vacuum degree of $1 \times 10^{-8}$ Torr, introducing thereinto a gaseous mixture of high purity argon gas and at least one reactive gaseous composition containing at least one component of semiconductor with keeping the pressure at $2-8 \times 10^{-4}$ Torr, applying a voltage to the anode with varying from 60 V to 150 V and applying a high frequency voltage of $\pm 1 - 2$ kV to the target, thereby inducing sputtering of the target and decomposition and ionization of the reactive gaseous composition.

The important advantage of this method consists in that a reactive gas such as $AsH_3$ or $PH_3$ is decomposed by discharge in a tetrode sputtering apparatus, mixed with the component gases transported by sputtering from a target consisting of a combination of two kinds of semiconductors and there is thus deposited on a substrate plate a metallic modified material controlled stoichiometrically and bonded homogeneously. In the case of sputtering a target containing a volatile component, not only a metallic modified material with a stoichiometric ratio but also a metallic modified material with a non-stoichiometric ratio but being controlled in deviation from the stoichiometric ratio can be deposited by controlling the partial pressure of a reactive gas containing the component.

Figure 8:
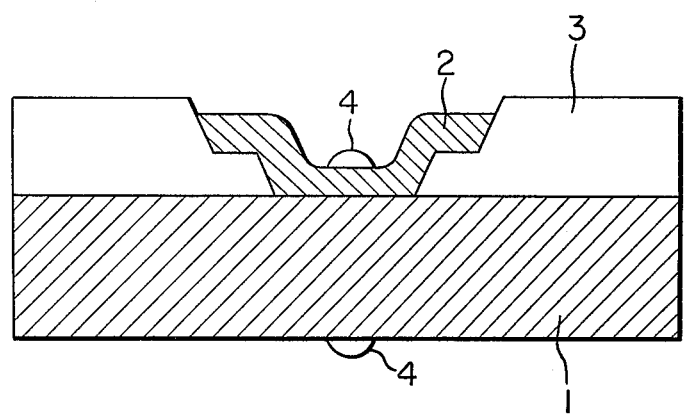
FIG. 8 is a cross sectional view of a heterojunction device consisting of a thin film and substrate and FIG. 9 is a cross sectional view of a semiconductor-superconductor heterojunction device consisting of a multilayer of thin films and substrates.
Figure 9:
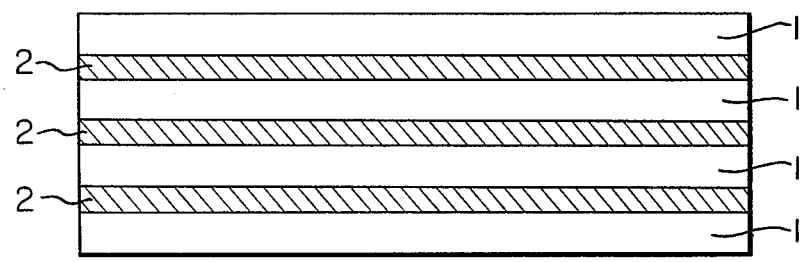

The metallic modified material of the present invention is available for new heterojunction devices through deposition on substrates of semiconductor crystals. FIG. 8 shows an example of heterojunction device wherein a metallic modified material of InSb 2 is deposited on a substrate plate 1 of a semiconductor crystal such as Si, Ge, InSb, GaAs, GaP, etc. by tetrode sputtering, 3 being an $SiO_2$ insulating film and 4 being an electrode. FIG. 9 shows an example of semiconductor-superconductor heterojunction device used at a low temperature, having a multi-layer structure of a semiconductor film 1 and metallic modified film 2 of InSb obtained by controlling the anode voltage of tetrode sputtering. Futhermore, in the ternary system and quaternary (four component) system metallic modified materials according to the present invention, the lattice constant can be changed by the composition thereof, thus making easier controlling of the lattice for a heterojunction.

What is claimed is:

1. A metallic modified material of InSb or alloys thereof with a rocksalt-type structure, which has the same chemical composition as an intermetallic compound semiconductor with a zincblende-type structure, which is stable at a temperature of up to 215° C. under a pressure of up to 80 Kbar, and which shows no change of structure at room temperature under the various pressures as shown in FIG. 7.

* * * * *